US008895925B2

(12) United States Patent
Torabi

(10) Patent No.: US 8,895,925 B2
(45) Date of Patent: Nov. 25, 2014

(54) ELECTROMAGNETIC INTERFERENCE PROTECTION STRUCTURE

(75) Inventor: Abbas Torabi, North Andover, MA (US)

(73) Assignee: Raytheon Company, Waltham, MA (US)

( * ) Notice: Subject to any disclaimer, the term of this patent is extended or adjusted under 35 U.S.C. 154(b) by 93 days.

(21) Appl. No.: 13/404,277

(22) Filed: Feb. 24, 2012

(65) Prior Publication Data

US 2013/0221219 A1  Aug. 29, 2013

(51) Int. Cl.
*G01J 5/20* (2006.01)

(52) U.S. Cl.
USPC ........................................................ 250/338.1

(58) Field of Classification Search
CPC ........................................................ G01J 5/20
USPC ........................................................ 250/338.1
See application file for complete search history.

(56) References Cited

U.S. PATENT DOCUMENTS

| 5,218,196 A * | 6/1993 | Dogul et al. | 250/221 |
|---|---|---|---|
| 2009/0017211 A1 | 1/2009 | Gruner et al. | |
| 2010/0056819 A1* | 3/2010 | Jang et al. | 556/478 |

OTHER PUBLICATIONS

Abbas Torabi, Carbon Based Electronic Devices Open A New Window to Electronics, Technology Today, Issue 1, Mar. 2011, pp. 47-48.
H. Wang, D. Nezich, J. Kong, T. Palacios, Graphene Frequency Multipliers, IEEE Electron Device Letters, vol. 30, No. 5, May 2009, pp. 547-549.

J.S. Moon, D. Curtis, D. Zehnder, S. Kim, D.K. Gaskill, G.G. Jernigan, R.L. Myers-Ward, C.R. Eddy, Jr., P.M. Campbell, K.-M. Lee, P. Asbeck, Low-Phase-Noise Graphene FETs in Ambipolar RF Applications, IEEE Electron Device Letters, Early Access, Jan. 2011.
Yu-Ming Lin, Phaedon Avouris, Nano Devices, vol. 8, No. 8, Jan. 29, 2008, pp. 1-18.
Christian Riedl;Thesis by Christian Riedl; Riedl, Christian. "Epitaxial graphene on silicon carbide surfaces: growth, characterization, doping, and hydrogen intercalation". Erlangen-Nurnberg, Univ. Diss., 2010.
Weiwei Cai, Yanwu Zhu, Xuesong Li, Richard D. Piner, and Rodney S. Ruoff in an article entitled "Large area few-layer graphene/graphite films as transparent thin conducting electrodes" Applied Physics Letters, vol. 95, Issue 12 pp. 123115-1 123115-3 (2009).
Application Note—Indium Tin Oxide J. A. Woolam Co., Inc, Prior to Jan. 30, 2012.

(Continued)

*Primary Examiner* — David Porta
*Assistant Examiner* — Hugh H Maupin
(74) *Attorney, Agent, or Firm* — Daly, Crowley, Mofford & Durkee, LLP

(57) ABSTRACT

A detector structure having a sensor for detecting energy impinging on the structure in the infrared and/or optical frequency band; an electronics section disposed behind the sensor for processing electrical signal produced by the sensor in response to the sensor detecting the infrared and/or optical energy; and an electrically conductive layer for inhibiting electromagnetic energy outside of the visible and infrared portions of the spectrum, such electrically conductive layer being disposed between impinging energy and the electronics section, such layer having a transmissivity greater than 90 percent in the visible and infrared portions of the spectrum and being reflective and/or dissipative to portions of the impinging energy outside of the visible and infrared portions of the spectrum. In one embodiment an electrically conductive layer having a substantially constant absorptivity to electromagnetic energy within the visible and infrared portions of the spectrum. In one embodiment, the layer is graphene.

21 Claims, 5 Drawing Sheets

(56) References Cited

OTHER PUBLICATIONS

R. A. Synowicki, "spectroscopic ellipsometery characterization of Indium tin oxide film microstructure and optical constants" Thin Solid Films, 313-314, 1998, pp. 394-397.

J.R. Bellingham, W. A. Phillips and C. J. Adkins, "Amorphous indium oxide" Thins Solid Films 195, 1991 pp. 23-31.

Tze-Chiang Chen, Tso-Ping Ma, and Richard C. Barker "infrared transparent and electically conductive thin films of In2O3" Applied Physics Letters, vol. 43, No. 10, Nov. 15, 1983, pp. 901-903.

P. Blake, P. D. Brimicombe, R. R. Nair, T. J. Booth, D. Jiang, F. Schedin, L. A. Ponomarenko, S. V. Morozov, H. F. Gleeson, E. W. Hill, A. K. Geim, K. S. Novoselov (2008). "Graphene-Based Liquid Crystal Device". Nano Letters 8 (6): 1704-1708).

K. Grodecki, A. Drabinska, R. Bozek, A. Wysmolek, K.P. Korona, W. Strupinski, J. Borysiuk, R. Stepniewski and J.M. Baranowski, "Optical Absorption and Raman Scattering Studies of Few-Layer Epitaxial Graphene Grown on 4H-SiC Substrates" Proceedings of the XXXVIII International School and Conference on the Physics of Semiconductors "Jaszowiec" 2009.

Joshua Robinson, Xiaojun Weng, Kathleen Trumbull, Randall Cavalero, Maxwell Wetherington, Eric Frantz, Michael Labella, Zachary Hughes, Mark Fanton, and David Snyder in "Nucleation of Epitaxial Graphene on SiC(0001)" ACS Nano vol. 4, No. 1, 2010 pp. 153-158.

* cited by examiner

ELECTROMAGNETIC INTERFERENCE PROTECTION STRUCTURE

TECHNICAL FIELD

This disclosure relates generally to electromagnetic interference protection structures and more particularly to radio frequency electromagnetic interference protection structures that are transparent to infrared and optical energy.

BACKGROUND AND SUMMARY

As is known in the art, sensors responsive of electromagnetic energy in both the optical and infrared spectrums are used in a wide variety of applications. One such application the sensors are arranged in an array, as for example as a focal plane array (FPA), to provide imagining. Outputs of these sensors are typically fed to read out electronics (ROE, sometimes also referred to as read out integrated circuit (ROIC) for processing. Typically the ROE is fabricated as an integrated circuit mounted behind the sensors.

In some applications, the array may be exposed to high intensity electromagnetic radiation, such as radio frequency radiation that may interfere with the ROE; referred to as Electromagnetic Interference or EMI. Therefore, in some applications, an electromagnetic interference protection structure is required to allow the infrared and/or optical energy to impinge upon the sensors while preventing other radiation from impinging upon the ROE. One such structure uses a thin film of optically transparent, highly conductive Indium Tin Oxide or Indium Oxide, which is thermally evaporated coating on the surface of the array of sensors. The Indium Tin Oxide, being electrically conductive, forms an electromagnetic shield over the ROIC or the FPA and prevents RF energy from reaching the ROIC. However, the Indium Tin Oxide coating does not provide adequate transparency in infrared part of the spectrum due to IR absorption of free carriers present in the material (see R. A. Synowicki, "spectroscopic ellipsometery characterization of Indium tin oxide film microstructure and optical constants" Thin Solid Films, 313-314, 1998, pp. 394-397, J. R. Bellingham, W. A. Phillips and C. J. Adkins, "Amorphous indium oxide" Thins Solid Films 195, 1991 pp. 23-31; and Tze-chiang Chen, Tso-ping Ma, and Richard C. Barker "infrared transparent and electrically conductive thin film of In2O3" Applied Physics Letters, Vol. 43, No. 10, Nov. 15, 1983, pp. 901-903) and the photoabsorption non-linearly increases in infrared (see P. Blake, P. D. Brimicombe, R. R. Nair, T. J. Booth, D. Jiang, F. Schedin, L. A. Ponomarenko, S. V. Morozov, H. F. Gleeson, E. W. Hill, A. K. Geim, K. S. Novoselov (2008). "Graphene-Based Liquid Crystal Device". Nano Letters 8 (6): 1704-1708). FIG. 1 shows the calculated extinction coefficient in the visible and near IR for Indium oxide film calculated from ellipsometric data, clearly showing the strong absorption in near infrared and a sharp increase in absorptivity in the infrared spectrum.

The inventor has recognized that carbon based two-dimensional (2D) crystalline graphene is composed of one atomic layer material and as such displays remarkable electronics and optical properties which can be exploited in numerous applications, because such a film of graphene is one atomic layer, is highly electrically conductive and does not have a significant absorption in optical and infrared spectrum and hence can be used as a protection layer for optical and IR devices. Further, because as noted above, ROE in many optical and infrared array detectors suffer from interference from stray radio frequency radiation and need to be protected to reduce noise and/or prevent damage to the electronics and hence graphene can provide such protection. Due to its special bandgap properties, graphene has zero bandgap energy and as such can absorb all optical photons with energies above zero, i.e. very long wavelength infrared, all the way up to optical and UV photons with energies in excess of several eV. However, owing to its one layer thickness, the total absorption remains very low. It has been reported in the literature [see K. Grodecki, A. Drabinska, R. Bozek, A. Wysmolek, K. P. Korona, W. Strupinski, J. Borysiuk, R. Stepniewski and J. M. Baranowski, "Optical Absorption and Raman Scattering Studies of Few-Layer Epitaxial Graphene Grown on 4H—SiC Substrates" Proceedings of the XXXVIII International School and Conference on the Physics of Semiconductors "Jaszowiec" 2009] that monoatomic layer graphene films have absorption of ~2.3% (see FIG. 2) in the visible and near infrared. However, since the film is single or perhaps a few atomic layers, the total absorption remains very low (at less than 10%) and thus the film is highly transparent in the optical spectrum.

I have calculated the absorption and transmission in RF region of the spectrum for a thin film based on a transmission line model and FIG. 3, shows this data as a function of film sheet resistivity. For EMI protection the film needs to be able transmit less than 10% of the impinging RF radiation, while dissipating and reflecting greater than 90% of it. This restriction places a further requirement on sheet resistivity of less than 100 Ohm/square on the EMI protection film. Further, we have calculated the EMI shielding effectiveness as: Shielding Effectiveness=10 Log(Incident power/Transmitted power) and plotted it as function of film sheet resistivity in FIG. 4, clearly confirming the sheet resistivity requirement for the EMI film at less than 100 Ohm/square. In FIG. 4, Pi/Pt is the ratio of radio frequency (RF) power incident on the thin film of graphene (Pi) to the radio frequency (RF) power transmitted through the thin film of graphene (Pt).

In accordance with the present disclosure, a detector structure is provided, comprising: a sensor for detecting energy impinging on the structure in the infrared and/or optical frequency band; an electronics section disposed behind the sensor for processing electrical signal produced by the sensor in response to the sensor detecting the infrared and/or optical energy; and an electrically conductive layer for inhibiting electromagnetic energy outside of the visible and infrared portions of the spectrum, such electrically conductive layer being disposed between the impinging energy and the electronics section, such layer having a transmissivity greater than 90 percent in the visible and infrared portions of the spectrum and being reflective and dissipative to portions of the impinging energy outside of the visible and infrared portions of the spectrum.

In one embodiment the layer is graphene.

In one embodiment, a detector structure is provided, comprising: a sensor for detecting energy impinging on the structure in the infrared and/or optical frequency band; an electronics section disposed behind the sensor for processing electrical signal produced by the sensor in response to the sensor detecting the infrared and/or optical energy; and an electrically conductive layer having a substantially constant absorptivity to electromagnetic energy within the visible and infrared portions of the spectrum with less than 5% variation in absorptivity in the visible and infrared spectrum.

In one embodiment, a detector structure is provided, comprising: a sensor for detecting energy impinging on the structure in the infrared and/or optical frequency band; an electronics section disposed behind the sensor for processing electrical signal produced by the sensor in response to the sensor detecting the infrared and/or optical energy; and a layer of graphene.

In one embodiment, the layer is less than four atomic layers of graphene.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

Like reference symbols in the various drawings indicate like elements.

DETAILED DESCRIPTION

Figure 1:
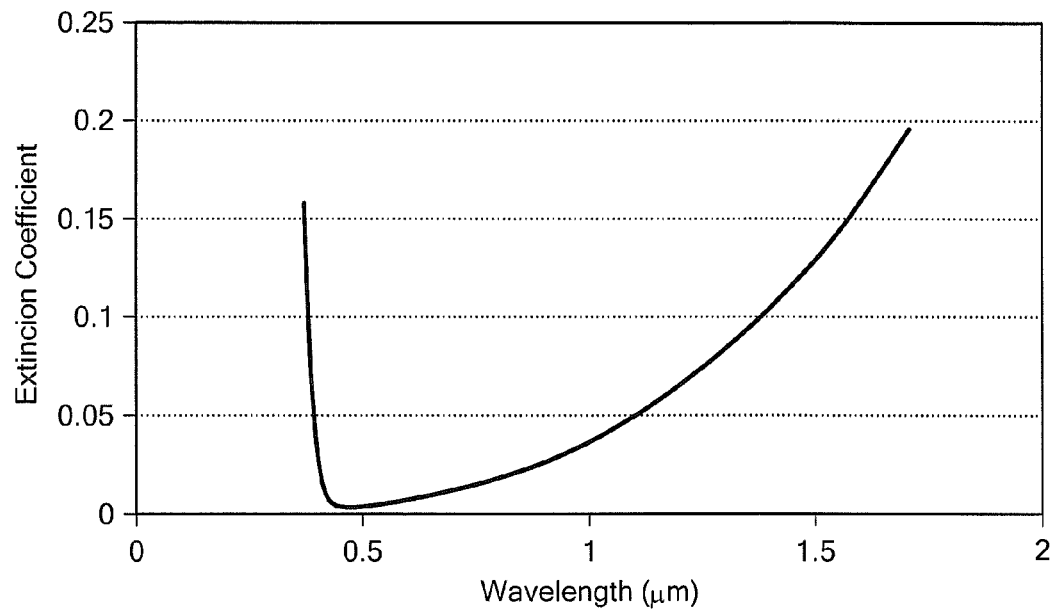
FIG. 1 shows the calculated extinction coefficient in the visible and near IR for Indium Oxide film calculated from ellipsometric data, clearly showing the strong absorption in near infrared.
Figure 2:
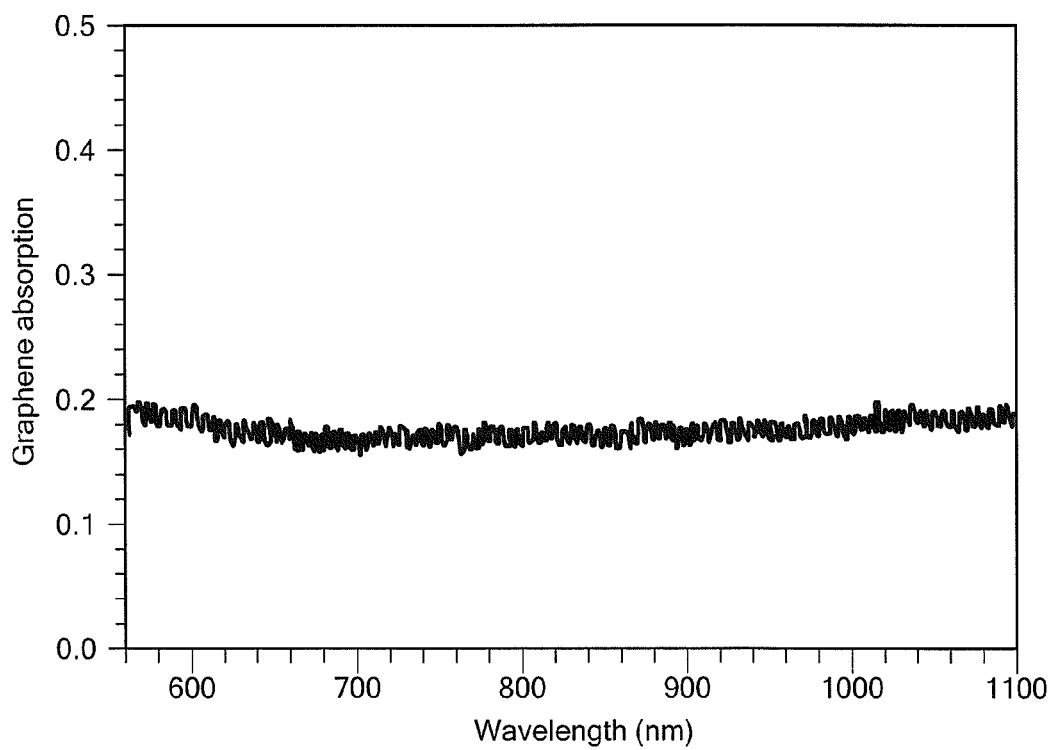
FIG. 2 shows the visible and near infrared absorption in graphene films.
Figure 3:
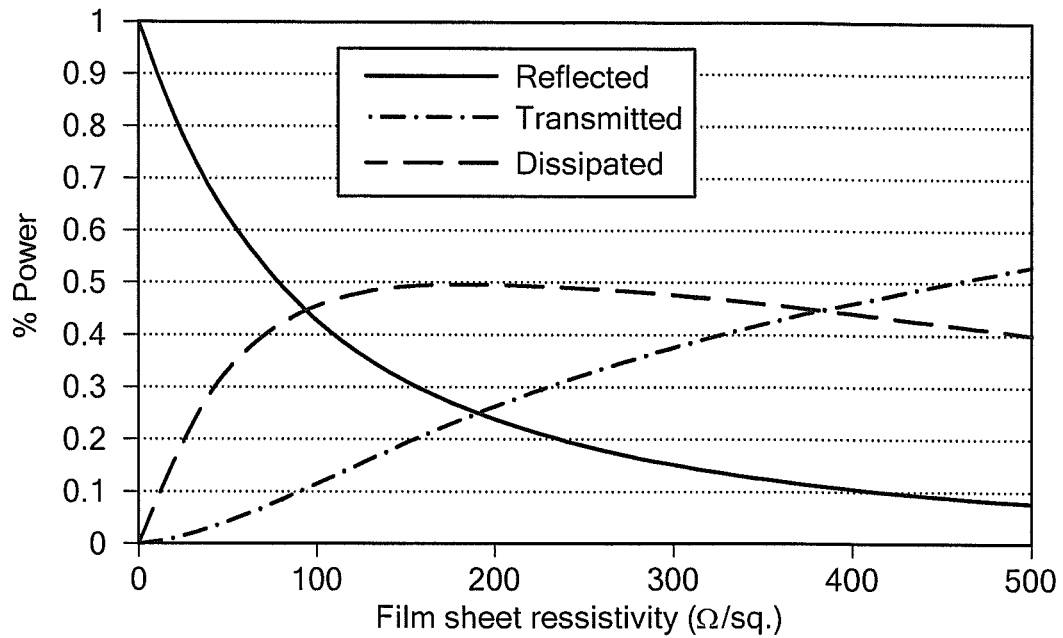
FIG. 3 shows RF reflected, transmitted and dissipated power as a monoatomic layer function of graphene films film resistivity as calculated from a transmission line model.
Figure 4:
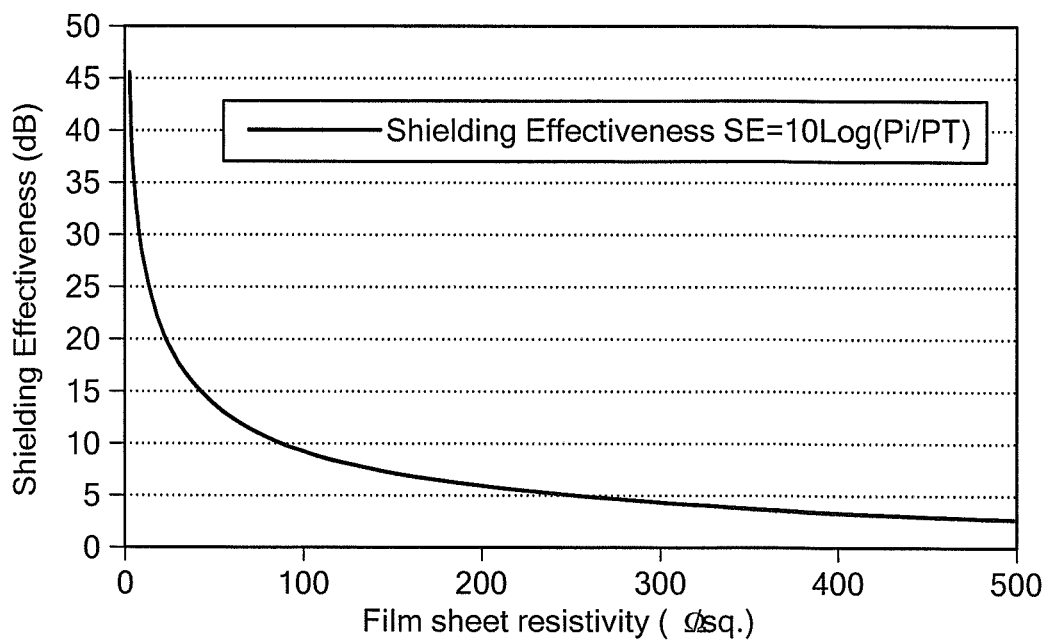
FIG. 4 shows calculated EMI shielding effectiveness plotted as function of film sheet resistivity.
Figure 5:
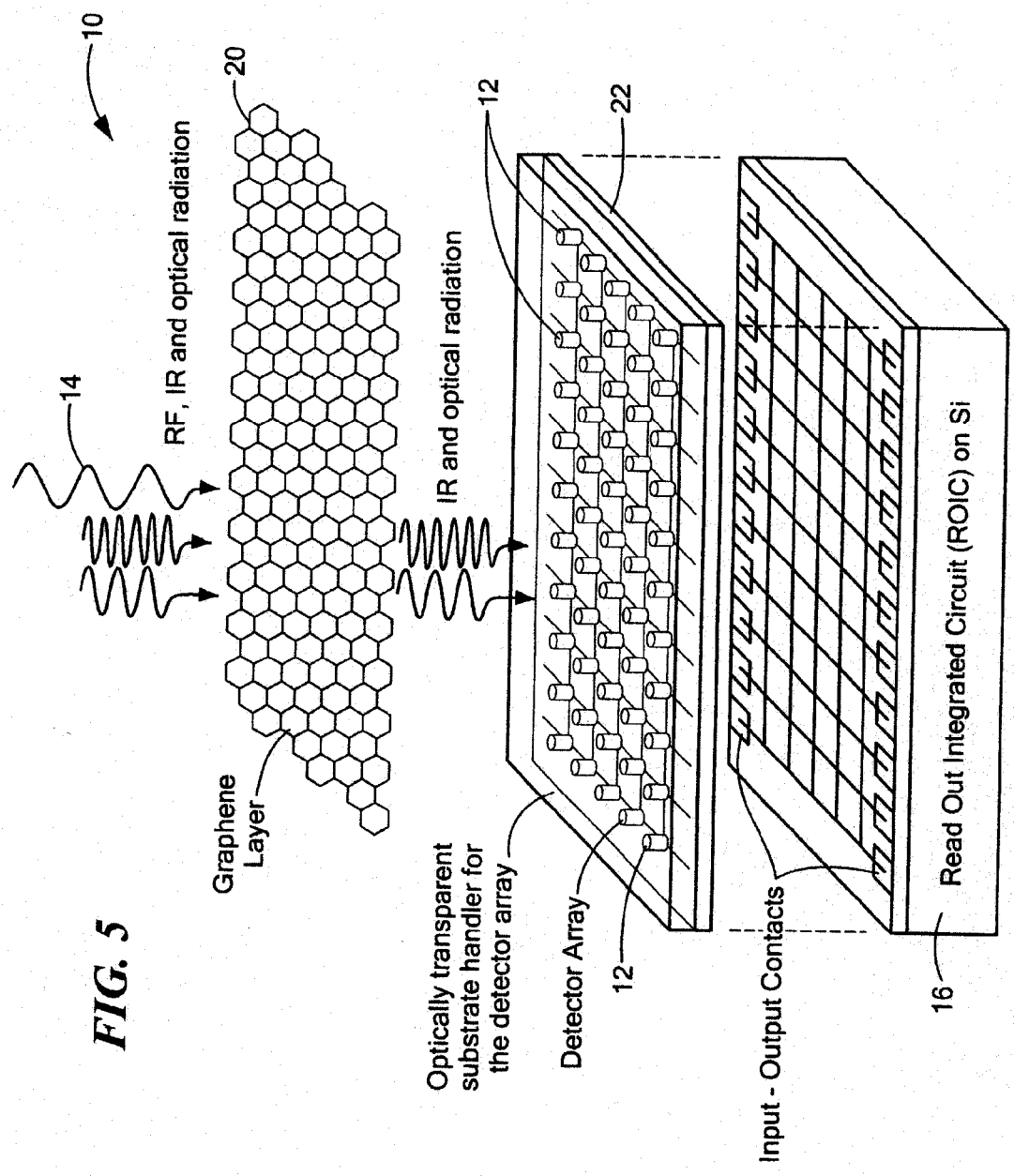
FIG. 5 is an exploded sketch of a detector structure according to one embodiment of the disclosure.

Referring now to FIG. 5, a detector structure 10 is shown having a focal plane array of sensors 12 for detecting energy, here indicated by arrows 14, impinging on the structure 10 in the infrared and/or optical frequency band. The structure 10 includes an electronics section 16, here disposed behind the sensors 12 for processing electrical signal produced by the sensor in response to the sensor detecting the infrared and/or optical energy, The structure 10 includes an electromagnetic interference protection structure 18 for inhibiting electromagnetic energy outside of the infrared and/or optical frequency band. More particularly, the electromagnetic interference protection structure 18 has a layer 20 of material disposed between impinging energy and the electronics section 16. The layer 20 has a greater absorptivity to such portions of the impinging energy outside of the infrared and/or optical frequency band than to portions of the impinging energy in the infrared and/or optical frequency band. Here the layer 20 is graphene.

More particularly, the detectors 12 are disposed on the back side of a transparent substrate 22 and are then flipped upside down and electronically coupled to the electronics section 16. Here, for example, the detectors 12 are PIN diode made of HgCdTe (Mercury Cadmium Telluride) for IR (infrared detection), but can be made of GaAs and AlGaAs/GaAs/AlGaAs or AlGaAs/InGaAs/AlGaAs quantum wells for near IR and Visible detections, and substrate 22 can be CdTe or ZnSe. The layer 20 of graphene is grown on the top of the transparent substrate 22. Here, for example, the graphene is grown by sublimation of SiC wafers; here as described by Joshua Robinson, Xiaojun Weng, Kathleen Trumbull, Randall Cavalero, Maxwell Wetherington, Eric Frantz, Michael LaBella, Zachary Hughes, Mark Fanton, and David Snyder in "Nucleation of Epitaxial Graphene on SiC(0001)" ACS Nano Vol. 4, No. 1 pp. 153-158. Here the film is obtained from Pennsylvania State University. The process results in a plane 2-dimensional crystalline planar structure of the graphene, and the drawing emphasizes the crystalline pattern. Here, the process is enhanced by a hydrogenation process described in a thesis by Christian Riedl; Riedl, Christian. "Epitaxial graphene on silicon carbide surfaces: growth, characterization, doping, and hydrogen intercalation". Erlangen-Nurnberg, Univ. Diss., 2010. The layer 20, here for example, has a thickness less than four atomic layers and: inhibits electromagnetic energy outside of the visible and infrared portions of the spectrum having a transmissivity greater than 90 percent in the visible and infrared portions of the spectrum and is reflective and/or dissipative to portions of the impinging energy outside of the visible and infrared portions of the spectrum; and has a substantially constant absorptivity to electromagnetic energy within the visible and infrared portions of the spectrum, with less than 5% variation in absorption coefficient.

Figure 6:
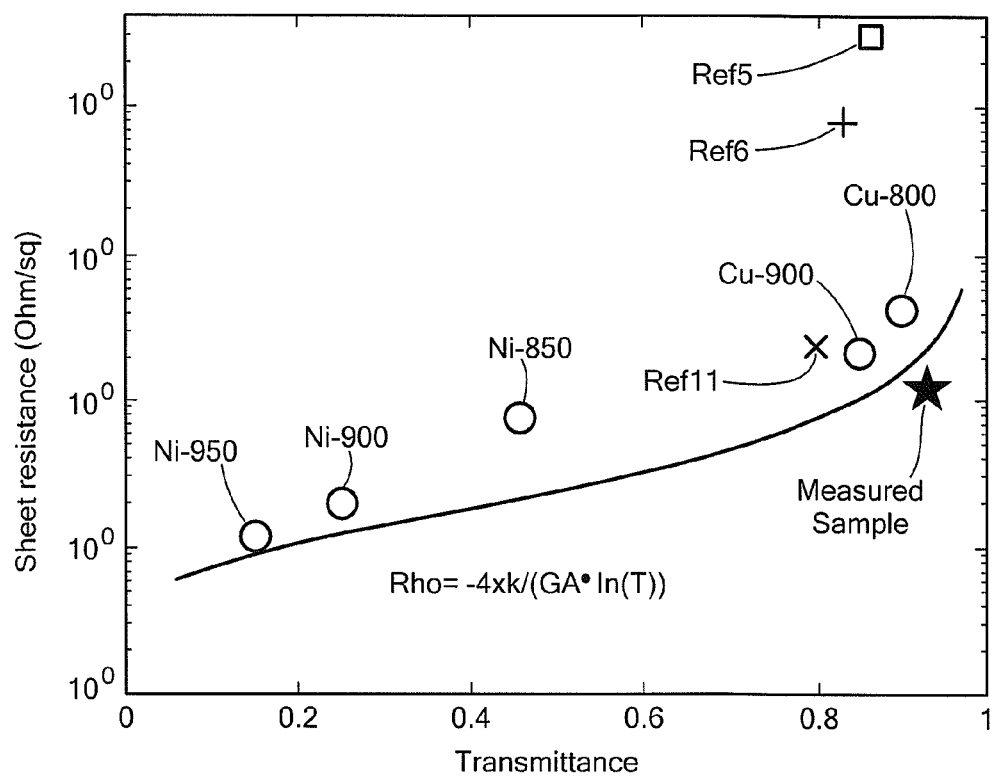
FIG. 6 is a graph showing Sheet resistivity vs. transmittance for various transparent graphene samples.

More particularly, the layer 20 has a substantially constant absorptivity to electromagnetic energy within the visible and infrared portions of the spectrum, here the absorptivity to electromagnetic energy within the visible and infrared portions of the spectrum varies by less than 5%, as shown in FIG. 6.

After forming the graphene layer 20, it is transferred onto the backside of the transparent substrate 22 which has formed therein the detectors 12 of the optical focal plane array (FPA) detector, and that is then electronically coupled to electronics section 16 by any conventional method or structure not shown. The electronics section 16 is now protected from EMI by the graphene layer 20.

The graphene provides an optically transparent, highly conductive layer that covers the transparent window in front of the array of detectors 12 and:
1. Allows optical and infrared radiation to pass through it and impinging onto the sensors behind it the detectors 12; and
2. Reflects and/or dissipates RF radiation and diminishes the RF intensity that reaches the electronics section 16.

The graphene layer 20 has the following properties:
1. Low radiation absorption coefficient of 2.3% in entire range of visible, IR spectrum
2. High conductivity of graphene demonstrated in the range of 100 Ohm/square.
3. Computed electromagnetic shielding efficiency of better than 10 dB for the graphene layer.

Weiwei Cai, Yanwu Zhu, Xuesong Li, Richard D. Piner, and Rodney S. Ruoff in an article entitled "Large area few-layer graphene/graphite films as transparent thin conducting electrodes" Applied Physics Letters, Vol. 95, Issue 12 Pages 123115-1 123115-3 (2009), show that graphene layers grown on different metals, such as nickel and copper can achieve low sheet resistivity and high optical transmission in the visible spectrum. FIG. 6 shows the sheet resistivity of various graphene films grown by the authors and other sources mentioned in the article, reaching an optical transmission of nearly 85% at 550 nm. More particularly, FIG. 6 shows sheet resistance vs. Optical transmission at 550 nm for samples of Graphene grown as described in the article by Cai et. al. referred to above, and the samples of the graphene described above acquired by Pennsylvania State University measured and indicated by the "star" in FIG. 6, The graphene samples indicated by the "star" had an optical transmission greater than 95% in the entire range of 500 nm to 20 um. The samples labeled "Ni-950", "Cu-850", etc. refer to samples described in the article by Cai et. al. referred to above and the samples labeled "Ref 5", "Ref 6" and "Ref 11" are references in the article by Cai et. al.

Figure 7:
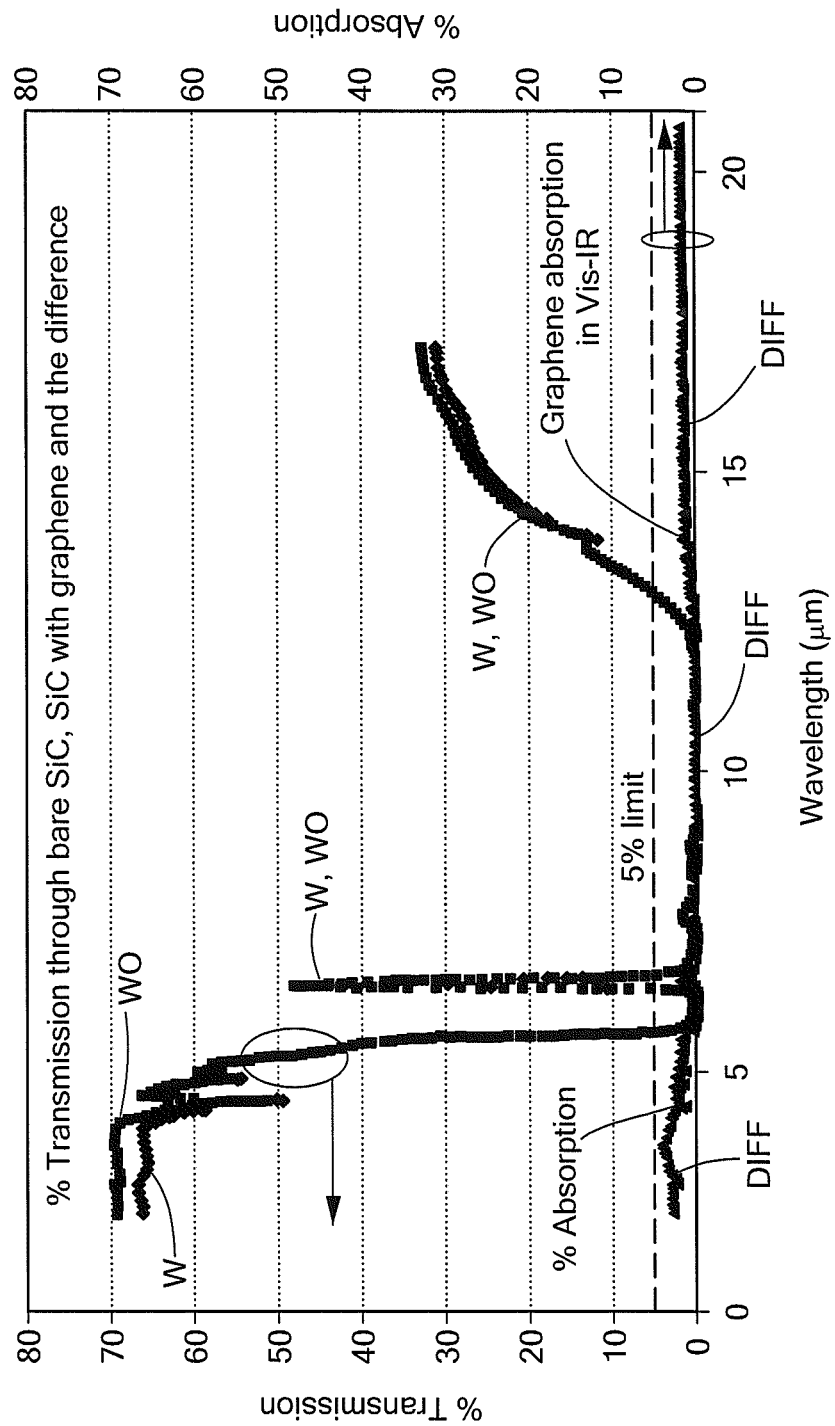
FIG. 7 is a graph showing Optical, near and middle IR absorption, and Transmission of a silicon carbide (SiC) substrate without a layer of graphene (labeled WO) thereon and a SiC substrate with a graphene film thereon (labeled W) having a thickness of a single atomic layer, the film being used in the detector structure of FIG. 5.

The sample indicated by the "star" in FIG. 6 shows sheet resistivity of 160 Ohm/square with transmission of 95% in entire range of 0.5 um to 20 um as shown in FIG. 7.

The transmission and absorption of samples with and without graphene, grown at Pennsylvania State University as described earlier, were measured in the visible and near, mid and long infrared spectrum from 500 nm to 20 um; see FIG. 7 The samples with graphene are labeled W (i.e., silicon carbide (SiC) with graphene) in FIG. 7 and the samples without graphene are labeled WO (i.e., SiC without graphene). The difference in percent (%) transmission between the samples W and the samples WO, i.e., the percent absorption) is shown in the curve labeled DIFF in FIG. 7. The curve DIFF clearly demonstrates less than 5% absorption and substantially constant (i.e., less than 5% variation) in the absorptivity of graphene in this range of electromagnetic spectrum (i.e., within the visible and infrared portions of the spectrum).

A number of embodiments of the disclosure have been described. Nevertheless, it will be understood that various modifications may be made without departing from the spirit and scope of the disclosure. For example: Increase of graphene thickness from a single atomic layer to less than four atomic layers, will provide additional conductivity improvements with some minor degradation of the optical absorption, which may be beneficial; Intentional doping of graphene with impurities such as nitrogen may provide additional conductivity improvements with some minor degradation of the optical absorption, which may be beneficial. Accordingly, other embodiments are within the scope of the following claims.

What is claimed is:

1. A detector structure, comprising:
    a sensor for detecting energy impinging on the structure in the infrared and/or optical frequency band;
    an electronics section disposed behind the sensor for processing electrical signal produced by the sensor in response to the sensor detecting the infrared and/or optical energy;
    an electrically conductive layer for inhibiting electromagnetic energy outside of the visible and infrared portions of the spectrum, such electrically conductive layer being disposed between the impinging energy and the electronics section, such layer having a transmissivity greater than 90 percent in the visible and infrared portions of the spectrum and being reflective by, and/or dissipative in, the layer to portions of the impinging energy outside of the visible and infrared portions of the spectrum.

2. The detector structure recited in claim 1 wherein the electrically conductive layer consists essentially of graphene.

3. The detector structure recited in claim 1 wherein the electrically conductive layer is graphene.

4. The detector structure recited in claim 3 wherein the electrically conductive layer consists of graphene.

5. The detector structure recited in claim 4 wherein the layer is less than four atomic layers.

6. A detector structure, comprising:
    a sensor for detecting energy impinging on the structure in the infrared and/or optical frequency band;
    an electronics section disposed behind the sensor for processing electrical signal produced by the sensor in response to the sensor detecting the infrared and/or optical energy;
    an electrically conductive layer having a substantially constant absorptivity to electromagnetic energy within the visible and infrared portions of the spectrum.

7. The detector structure recited in claim 6 wherein the absorptivity to electromagnetic energy within the visible and infrared portions of the spectrum varies by less than 5%.

8. The detector structure recited in claim 7 wherein the electrically conductive layer consists of doped graphene.

9. The detector structure recited in claim 8 wherein the layer is less than four atomic layers.

10. The detector structure recited in claim 6 wherein the electrically conductive layer consists of crystalline graphene.

11. The detector structure recited in claim 10 wherein the layer is less than four atomic layers.

12. A detector structure, comprising:
    a layer of graphene;
    a sensor for detecting energy impinging on the structure in the infrared and optical frequency band, the sensor being disposed behind the layer of graphene;
    an electronics section disposed behind the sensor for processing electrical signal produced by the sensor in response to the sensor detecting the infrared and optical energy;
    wherein the layer of graphene disposed passes the infrared and optical frequency bands to the sensor while inhibiting electromagnetic energy outside of the infrared and optical frequency bands from passing to the electronics section.

13. The detector structure recited in claim 12 wherein the layer is less than four atomic layers of graphene.

14. The detector structure recited in claim 12 wherein the electrically conductive layer consists of doped graphene.

15. The detector structure recited in claim 14 wherein the layer is less than four atomic layers.

16. The detector structure recited in claim 12 wherein the graphene is crystalline.

17. The detector structure recited in claim 12 wherein the graphene is carbon based two-dimensional (2D) crystalline graphene.

18. A detector structure, comprising:
    a 2-dimensional crystalline planar structure of the graphene;
    an array of sensors disposed behind the 2-dimensional crystalline planar structure of the graphene for detecting energy impinging on the detector structure in the infrared and/or optical frequency band;
    an electronics section disposed behind the array of sensors for processing electrical signal produced by the array sensor in response to the array of sensor detecting the infrared and/or optical energy; and
    wherein the 2-dimensional crystalline planar structure of the graphene passes the infrared and/or optical frequency bands to the sensor array while inhibiting electromagnetic energy outside of the infrared and/or optical frequency band from passing to the electronic section.

19. The detector structure recited in claim 18 wherein the 2-dimensional crystalline planar structure of the graphene passes the infrared and optical frequency bands to the sensor array while inhibiting electromagnetic energy outside of the infrared and optical frequency band from passing to the electronic section.

20. The detector structure recited in claim 18 wherein the 2-dimensional crystalline planar structure of the graphene comprises a layer of the 2-dimensional crystalline planar structure of the graphene and wherein the layer is disposed over the array of sensors.

21. The detector structure recited in claim 19 wherein the 2-dimensional crystalline planar structure of the graphene comprises a layer of the 2-dimensional crystalline planar structure of the graphene and wherein the layer is disposed over the array of sensors.

* * * * *